United States Patent
Luo et al.

(10) Patent No.: US 11,458,983 B2
(45) Date of Patent: Oct. 4, 2022

(54) SYSTEM AND METHOD FOR MANAGING FLEXIBLE CONTROL OF VEHICLES BY DIVERSE AGENTS IN AUTONOMOUS DRIVING SIMULATION

(71) Applicants: Jun Luo, Toronto (CA); Julian Villella, Mississauga (CA); Mohsen Rohani, Gatineau (CA); David Rusu, Markham (CA); Montgomery Alban, Markham (CA); Seyed Ershad Banijamali, Toronto (CA)

(72) Inventors: Jun Luo, Toronto (CA); Julian Villella, Mississauga (CA); Mohsen Rohani, Gatineau (CA); David Rusu, Markham (CA); Montgomery Alban, Markham (CA); Seyed Ershad Banijamali, Toronto (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 48 days.

(21) Appl. No.: 16/989,776

(22) Filed: Aug. 10, 2020

(65) Prior Publication Data
US 2022/0032935 A1 Feb. 3, 2022

Related U.S. Application Data

(63) Continuation-in-part of application No. 16/941,505, filed on Jul. 28, 2020.

(51) Int. Cl.
*B60W 50/08* (2020.01)
*B60W 40/06* (2012.01)

(52) U.S. Cl.
CPC .......... *B60W 50/082* (2013.01); *B60W 40/06* (2013.01); *B60W 50/085* (2013.01); *B60W 2556/50* (2020.02)

(58) Field of Classification Search
None
See application file for complete search history.

(56) References Cited

U.S. PATENT DOCUMENTS

| 11,124,204 B1* | 9/2021 | Narang | B60W 60/0011 |
| 11,132,211 B1* | 9/2021 | Tang | G06N 20/00 |
| 11,164,479 B1* | 11/2021 | Madison | G06T 19/006 |

(Continued)

FOREIGN PATENT DOCUMENTS

| CN | 110427682 A | 11/2019 |
| CN | 110850861 A | 2/2020 |
| CN | 110861634 A | 3/2020 |

OTHER PUBLICATIONS

Madrigal, A. "Inside Waymo's Secret World for Training Self-Driving Cars" The Atlantic, Aug. 23, 2017.

(Continued)

*Primary Examiner* — David P. Merlino

(57) ABSTRACT

Method and system for controlling the behavior of an object. Behavior of the object is controlled during a first time period by using a first agent that applies a first behavior policy to map observations about the object and the environment in the first time period to a corresponding control action. Control is transitioned from the first agent to a second agent during a transition period following the first time period. Behavior of the object during a second time period following the transition period is controlled by using a second agent that applies a second behavior policy to map observations about the object and the environment in the second time period to a corresponding control action that is applied to the object. During transition the first agent applies the first behavior policy control the object and the second agent applies the second behavior policy to map observations about the object and the environment to corresponding control actions that are not applied to the object.

16 Claims, 8 Drawing Sheets

(56) References Cited

U.S. PATENT DOCUMENTS

| | | | |
|---|---|---|---|
| 2018/0107214 A1* | 4/2018 | Chandy | B62D 15/025 |
| 2018/0326994 A1* | 11/2018 | Sakai | B60W 40/08 |
| 2019/0049960 A1* | 2/2019 | Battles | G05D 1/0214 |
| 2019/0354105 A1 | 11/2019 | Cunningham | |
| 2020/0125651 A1* | 4/2020 | Srouji | G06T 17/05 |
| 2020/0159215 A1 | 5/2020 | Ding et al. | |
| 2020/0293041 A1* | 9/2020 | Palanisamy | G06N 3/08 |
| 2021/0188289 A1* | 6/2021 | Oba | B60W 40/08 |
| 2021/0229706 A1* | 7/2021 | Jones | B60W 60/0057 |

OTHER PUBLICATIONS

Vogt, K. "The Disengagement Myth", a blog post from Cruise Automation, Jan. 2020.

Carla—Open-source simulator for autonomous driving research. https://carla.org/. Before Jul. 2020.

Alvarez Lopez, P. et al. "Microscopic Traffic Simulation using SUMO", IEEE Intelligent Transportation Systems Conference (ITSC), 2018.

"FlightGear" from From Wikipedia, the free encyclopedia. https://en.wikipedia.org/wiki/FlightGear; page created Dec. 13, 2002.

"Dual control" from Wikipedia, the free encyclopedia. http://wiki.flightgear.org/Dual_control, page created May 10, 2008.

'Howto:Multiplayer' from Wikipedia, the free encyclopedia. http://wiki.flightgear.org/Howto:Multiplayer, page created Apr. 19, 2006.

"Aimsun.Next—Your Personal Mobility Modeling Lab" https://www.aimsun.com/aimsun-next/; Before Jul. 2020.

"Final release of Aimsun Next 8.4" https://www.aimsun.com/latest/final-release-aimsun-next-8-4/ May 17, 2019.

Casasab, J. et al. "The need to combine different traffic modelling levels for effectively tackling large-scale projects . . . " Procedia—Social and Behavioral Sciences, vol. 20, 2011, pp. 251-262.

* cited by examiner

SYSTEM AND METHOD FOR MANAGING FLEXIBLE CONTROL OF VEHICLES BY DIVERSE AGENTS IN AUTONOMOUS DRIVING SIMULATION

CROSS-REFERENCE TO RELATED APPLICATIONS

This application is a continuation-in-part of U.S. patent application Ser. No. 16/941,505 filed Jul. 28, 2020, entitled "System and Method for Managing Flexible Control of Vehicles by Diverse Agents in Autonomous Driving Simulation", which is incorporated herein by reference.

FIELD

The present disclosure relates to control agents for robots in simulation environments.

BACKGROUND

Research and Development (R&D) in the field of autonomous robot control relies heavily on simulation for training, testing, evaluation, validation of autonomous driving software agents that control vehicles. In general, the more realistic and diverse the simulation, the more useful it is. Realism of simulation keeps the simulated environment true to the real world. Diversity of simulation, especially diversity in the simulated interaction between autonomous robots (e.g. the ego vehicles under the control of the main autonomous driving software agent being developed) and other traffic participants (especially social vehicles) not being controlled by the main autonomous driving software agent being developed, ensures coverage of behavior variations (i.e. variations in the behavior of the ego and social vehicles) in the real world. Key to realism and diversity is the behavior of traffic participants, especially social vehicles, during their interaction with ego vehicles and with each other. Meanwhile, behavior of social vehicles needs to be combinable, controllable, configurable, and automatable to allow expressive and repeatable simulations crucial for effective training, testing, evaluation, and validation and training of autonomous driving software agents. Hence, autonomous driving simulation needs to provide realistic and diverse interactive behaviors of social vehicles and appropriate mechanism to combine, control, configure and automate the use of such behaviors. This in turn means that even though the primary goal of autonomous driving R&D is to develop a single agent that is a competent autonomous driver, autonomous driving simulation needs to flexibly combine multiple diverse agents to aid the development of such a single agent.

Existing simulation systems provide limited options for independent control of social vehicles in a simulated environment.

Accordingly, there is need for systems and methods that enable flexible control by different autonomous driving software agents that are used to control simulated vehicles, including social vehicles as well as ego vehicles, in autonomous driving simulations.

SUMMARY

The present disclosure describes methods and systems that enable control of an object to be transitioned from a first agent that applies a first behavior policy to a second agent that applies a second behavior policy. A behavior policy is a functional component that maps observations to control actions. The control of the object is transitioned during a transition period that can enable the second agent to be initialized so as to facilitate a smooth transition when transitioning control of the object from the first agent to the second agent. Example embodiments may enable an object to be controlled in diverse ways across diverse scenarios using autonomous driving software agents that are specialized for such scenarios. The use of specialized autonomous driving software agents may reduce the computation resources (e.g., processor operations and/or memory access and capacity) required for controlling the object in some applications, including simulated environments where several autonomous driving software agents may need to be controlled simultaneously.

In at least one example aspect, the present disclosure describes a computer implemented method for controlling the behavior of an object, comprising: controlling the behavior of the object during a first time period by using a first agent that applies a first behavior policy to map observations about the object and the environment in the first time period to a corresponding control action that is applied to the object; transitioning control of the behavior of the object from the first agent to a second agent during a transition period following the first time period; and controlling the behavior of the object during a second time period following the transition period by using a second agent that applies a second behavior policy to map observations about the object and the environment in the second time period to a corresponding control action that is applied to the object. During the transition period the first agent applies the first behavior policy to map observations about the object and the environment in the transition period to a corresponding control action that is applied to the object and the second agent applies the second behavior policy to map observations about the object and the environment in the transition period to corresponding control actions that are not applied to the object.

In at least the preceding example aspect, the observations mapped by the first behavior policy and the observations mapped by the second behavior policy are each from respective, different, observation spaces.

In at least some of the preceding example aspects, during the transition period a set of observations about the object and the environment are modified to include observations about the object and the environment required by the second behavior policy.

In at least some of the preceding example aspects, first time period corresponds to a time that the object is present in a first zone defined by a first spatiotemporal boundary, the second time period corresponds to a time when the object is present in a second zone defined by a second spatiotemporal boundary, and the transition period corresponds to a time when the object in present within a transitional zone between the first zone and the second zone, the method including performing the transitioning upon detecting presence of the object in the transition zone following presence of the object in the first zone.

In at least some of the preceding aspects, the method further comprises transitioning control of the behavior of the object from the second agent to the first agent during a further transition period following the second time period. During the further transition period the second agent applies the second behavior policy to map observations about the object and the environment in the second transition period to a corresponding control action that is applied to the object and the first agent applies the first behavior policy to map observations about the object and the environment in the further transition period to corresponding control actions that are not applied to the object.

In at least some of the preceding example aspects, the method is applied during a simulation run, the object is a simulated object and the observations about the object and the environment are simulated observations about the object and the environment.

In at least some of the preceding example aspects, the object is a simulated social vehicle operating in a simulated environment that also includes a simulated ego vehicle that is controlled throughout the first time period, transition period and second time period by a respective ego agent that applies an ego behavior policy to map ongoing observations about the ego vehicle and the environment to corresponding ego vehicle control actions that are applied to the ego vehicle.

In at least some of the preceding example aspects, the second zone and the transition zone are fixed in a virtual position that moves with the virtual location of the simulated ego vehicle within the simulated environment.

In at least some the preceding example aspects, the second zone and the transition zone are fixed in a virtual position that is stationary with a virtual physical location within the simulated environment.

In at least some of the preceding example aspects, the first behavior policy is less computationally intensive than the second behavior policy.

In at least some of the preceding example aspects, the second behavior policy is configured to map observations about the object and the environment from an observation space that is enriched relative to an observation space that the first behavior policy is configured to map observations about the object and the environment from.

In at least some of the preceding example aspects, the second behavior policy is configured to map observations about the object and the environment to control actions from an action space that is enriched relative to an action space that the first behavior policy is configured to map observations about the object and the environment to control actions from.

According to a further example aspect is a computer system comprising a processor and a non-transitory memory coupled to the processor, the memory storing instructions that, when executed by the processor, configure the computer system to perform the method of any of the preceding aspects.

According to a further example aspect is computer program product comprising a non-transitory computer medium storing instructions for configuring a computer system to perform the method of any of the preceding aspects.

BRIEF DESCRIPTION OF THE DRAWINGS

For a more complete understanding of example embodiments, and the advantages thereof, reference is now made to the following detailed description taken in conjunction with the accompanying drawings, in which.

Similar reference numerals may have been used in different figures to denote similar components.

DESCRIPTION OF EXAMPLE EMBODIMENTS

Figure 1:
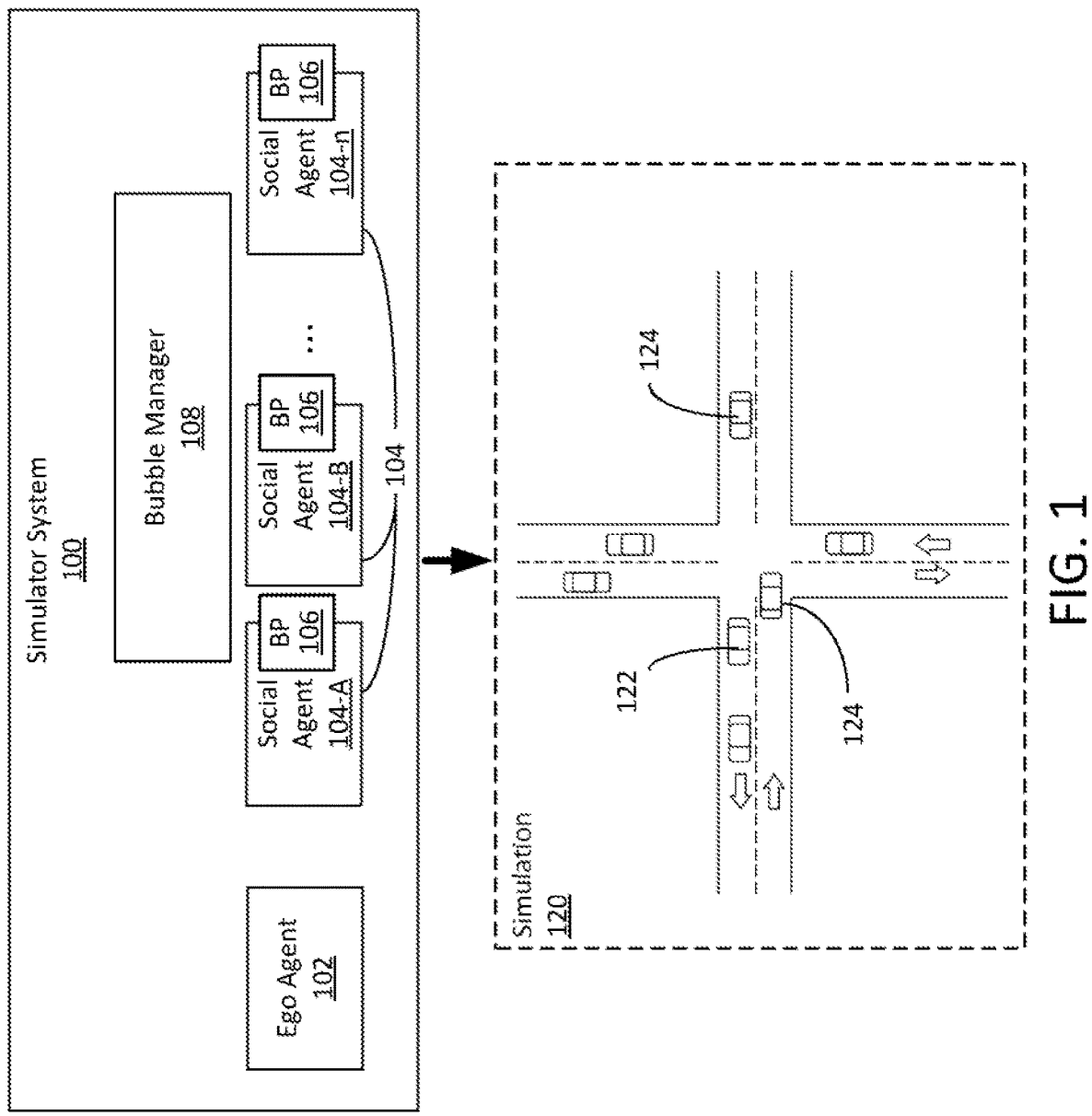
FIG. 1 is a schematic diagram illustrating a simulator system and an example simulation, in accordance with an example embodiment.

FIG. 1 is a schematic diagram of a simulator system 100 and a representative simulation 120 generated by the simulator system 100 during a simulation run. In example embodiments, simulator system 100 is used to train an artificial intelligence (AI) controller for controlling a vehicle. As used in this disclosure, a vehicle refers to a controllable mobile object, and may include, among other things, an automobile, truck, bus, marine vessel, airborne vehicle, farm equipment, military equipment, warehouse equipment, construction equipment, and other robots.

The AI controller for a vehicle can incorporate one or more trained autonomous driving software agents (hereinafter generically referred to as agent and collective referred to as agents). An agent is a computer-implemented program or program module that applies a learned behavior model (i.e., a learned behavior policy) to map observations about the vehicle and the environment to a respective control action (i.e. an action used to control the vehicle). In a real world application, the subject vehicle includes a set of sensors for sensing data, which collectively provide observations about the vehicle and the environment, and a set of controllers for controlling vehicle actuators in response to a respective action generated by the agent. The observations about the vehicle and the environment includes sensed information about operating characteristics of the vehicle (e.g., state of vehicle actuators, vehicle pose, vehicle linear and angular speed and acceleration) as well as sensed information about the environment the vehicle is operating in (e.g., image derived from LIDAR, image and/or radar units).

Simulator system 100 is configured to generate real-world simulations 120 (i.e. simulations of a real world environment) that are used for training agents across a range of simulation scenarios before the trained agents are transferred to AI controllers of real world vehicles that are to be operated in a real world environment.

In this regard, simulator system 100 is configured to run simulations 120 that include a simulated ego vehicle 122 and one or more simulated social vehicles 124 (i.e. other vehicles in the operating environment of the ego vehicle 122). In an example embodiment, the simulator system 100 includes an ego agent 102 for controlling simulated ego vehicle 122. The simulated ego vehicle 122 is the primary object of interest in the simulation and the ego agent 102 is being trained to learn an ego agent behavior policy. The trained ego agent 122 may be transferred to an AI controller of a real world ego vehicle for controlling the real world vehicle in a real world environment. The ego agent 102 receives simulated observations about the state of simulated ego vehicle 122, and maps those observations about the state of the simulated ego vehicle 122 to ego vehicle control actions for the simulated ego vehicle 122 to perform in the simulated environment. During a simulation run, this process is repeated over multiple simulation time steps. Simulated social vehicles 124 are provided to interact with simulated ego vehicle 122 in simulations 120. Simulated social vehicles 124 are provided to simulate the behavior of real world social vehicles that a real world ego vehicle would interact with.

In example embodiments, simulator system 100 is configured to implement instances of social agents 104 that apply respective behavior policies to control behavior of one or more social vehicles 124 such that they function independently of the ego vehicle 122. The simulator system 100 is configured to activate instances of social agents 104 that control the simulated behavior of social vehicles 124.

In some simulation environments a possible solution can be to use a single social agent to manage all the behavior of all social vehicles in all situations. However, such a solution can face challenges in terms of computational requirements and an inability to provide a diversity of experiences. Such a ubiquitous agent would require a great deal of computational resources such as processor time and memory space. For computational scalability of simulation, it may not be desirable or practical to simulate social vehicle behaviors and interaction at the highest level of fidelity in all scenarios.

Accordingly, in example embodiments, the social agents 104 include different types of social agents (e.g. social agents 104-A to 104-*n*) that can respectively apply different behavior polices (BP 106) for controlling social vehicle behavior (i.e. behavior of a simulated social vehicle 124). For example, social agent 104-B may apply a different behavior policy 106 than social agent 104-A and so on. In at least some examples, this can enable computationally efficient social agents 104 that are specialized at some aspects of social vehicle control but not suitable for other aspects. For example, a social agent 104-B may be a powerful and compute-intensive agent that can be used to control a social vehicle 124 where fine-grained interaction matters, such as dealing with unprotected left turn, busy intersection, or on-ramp merge. Where fidelity of intersection does not matter as much, such as in a constant-speed lane following situation, a much simpler and less computationally intensive social agent 104-A could be used.

In example embodiments, the different social agents 104 may have different observation spaces and different action spaces than each other. For example, one social agent 104 may be configured to receive simulated image data, whereas another may be configured to receive simulated radar data. In some examples, an action space is the set of control action available from the observations and an observation space is the set of observations about the vehicle and the environment.

The use of multiple social agents 104 can also enable a diverse range of social vehicle behavior, thereby enabling the ego agent 102 to be presented with a wide and diverse range of training, testing, validation, and evaluation scenarios. Behavioral diversity of the social vehicles may provide a realistic simulation of the different driving style and different abilities of human drivers that contribute to the complexity of real interaction on a real world road.

In example embodiments, control of a social vehicle 122 during a simulation run of a simulation 120 may be transitioned from one social agent 104-A to a different social agent 104-B as the social vehicle 124 moves from a simulation experience requiring one level of control to a simulation experience that requires a different level of control. A specific social agent 104 can be associated with a specific ego vehicle 124 in view of a specific operational scenario to effect a specific behavior. The agent-vehicle-scenario-behavior match can change as required by the simulation scenario. Accordingly, as will be described below, example embodiments are directed towards dynamically changing and managing agent-vehicle associations during a simulation run.

In example embodiments, simulator system 100 may use a heterogeneous computing configuration to implement social agents 104 that apply respective behavioral policies. The various social agents 104 may be based on behavior policies 106 that are scripted, based on model predictive control or similar classical methods, or data-driven and trained through imitation learning or reinforcement learning.

At any time, a single instance of a social agent 104 may control a single social vehicle 122 or may control multiple social vehicles 122 together as a spatial or logical group in batch mode. Different types of social agents 104 may be specifically designed for particular scenarios or tasks such as highway merge, following a lane or handling stop signs, but may not be suitable for other scenarios. As previously suggested, different types of social agents 104 may assume different observation spaces and action spaces. Some social agents 104 may be configured to operate in observation and action spaces that are more enriched (e.g., have a greater number of possible observations actions, or higher dimensional observations or actions) than the observation and action spaces that other social agents 104 are suitable for.

In some example embodiments, at specific point in space and time or when specific conditions are met during the course of a simulation run, control of a subset of social vehicles 124 may be transferred from one social agent 104-A to another social agent 104-B, so as to use the most suitable type of social agent 104 to provide the most suitable interaction, without wasting unnecessary computing resources to simulate every detail of the interaction where it does not matter. In example embodiments, simulator system 100 is configured to flexibly choose from a set of diverse social agents 104 that are used to control social vehicles 124 in the simulation environment.

In example embodiments, simulator system 100 is configured to recognize constraints in respect of agent-vehicle-scenario-behavior matches when making agent-vehicle assignments. For example, a social agent 104 may be configured to expect specific types of simulated observations to be delivered from an assigned social vehicle 124 and expect the social vehicle 124 to be able to perform specific types of actions (in some examples, via intermediate controllers). Accordingly, a specific social agent 104 may be only suitable for some scenarios and behaviors but not others. Consequently, simulator system 100 is configured to make agent-vehicle assignments to satisfy compatibility in terms of matching observation and control spaces. In some examples, a change in social agent 104 also requires modifications to the simulated social vehicle 124. For example, the simulated social vehicle 124 may need to be prepared with the appropriate simulated sensors and actuators which in turn may need time to be appropriately initialized. Among other things, initializing the simulated social vehicle 124 may include reconfiguring the simulated vehicle 124 by at least one of installing new simulated sensors (such as a simulated LiDAR) and enhancing the simulated physical body—for example, replacing a simple rectangular box with an articulated vehicle body with wheels independently represented with corresponding friction coefficients.

In addition, there are constraints on the switching of vehicle control between social agents 104. Vehicles have mass and inertia, and thus abrupt control change may be physically inappropriate. An incoming social agent 104 may need multiple simulation steps to appropriately initialize its internal state. The incoming social agent 104 may need to during the transition period acquire enough history about the observations about the simulated social vehicle 124 and its' surrounding environment to correctly predict future observations and corresponding action. In example embodiments, simulator system 100 is configured to ensure a smooth agent-to-agent handover of control of a vehicle 124 in view of such constraints. In example embodiments, a smooth handover is characterized by the absence of unreasonable change of the simulated physical behavior of the simulated social vehicle 124, and the absence of inconsistent internal control states of the incoming social agent 104.

Accordingly, in an example embodiment, simulator system 100 is configured to implement a bubble manager 108 for managing dynamic agent-vehicle assignment. Bubble manager 108 is configured to apply a "zone-based transition" methodology for managing the dynamic switching of the control of a simulated social vehicle 124 between different social agents 104.

As used in this disclosure, "bubble" defines a region in which a specific agent-vehicle assignment holds if the simulated social vehicle 124 is present in the region. The boundaries of a bubble are typically spatiotemporal. In some examples, a bubble may be statically defined with respect to a simulation map. In some examples, a bubble may be tied to a specific object, such as the simulated ego vehicle 122, and move with that object through the simulation map. In some examples, the bubble can alternatively be defined by other expressible logical or functional conditions. The bubble that a simulated social vehicle 124 is located in at a given time determines the type of social agent 104 that is to be used for controlling the simulated social vehicle 124.

In example embodiments, the types of social agents 104 are primarily specified in terms of the kinds of observations that need to be supplied from the simulated social vehicle 124 to the social agent 104 and the kinds of actions from the social agent 104 that are expected to be executed by the simulated social vehicle 124. In example embodiments, the bubble manager 108 is a system that is configured to manage the definition, creation, activation, updating, application (i.e. orchestration of control switch), deactivation, and destruction of bubbles during a simulation run.

Figure 2:
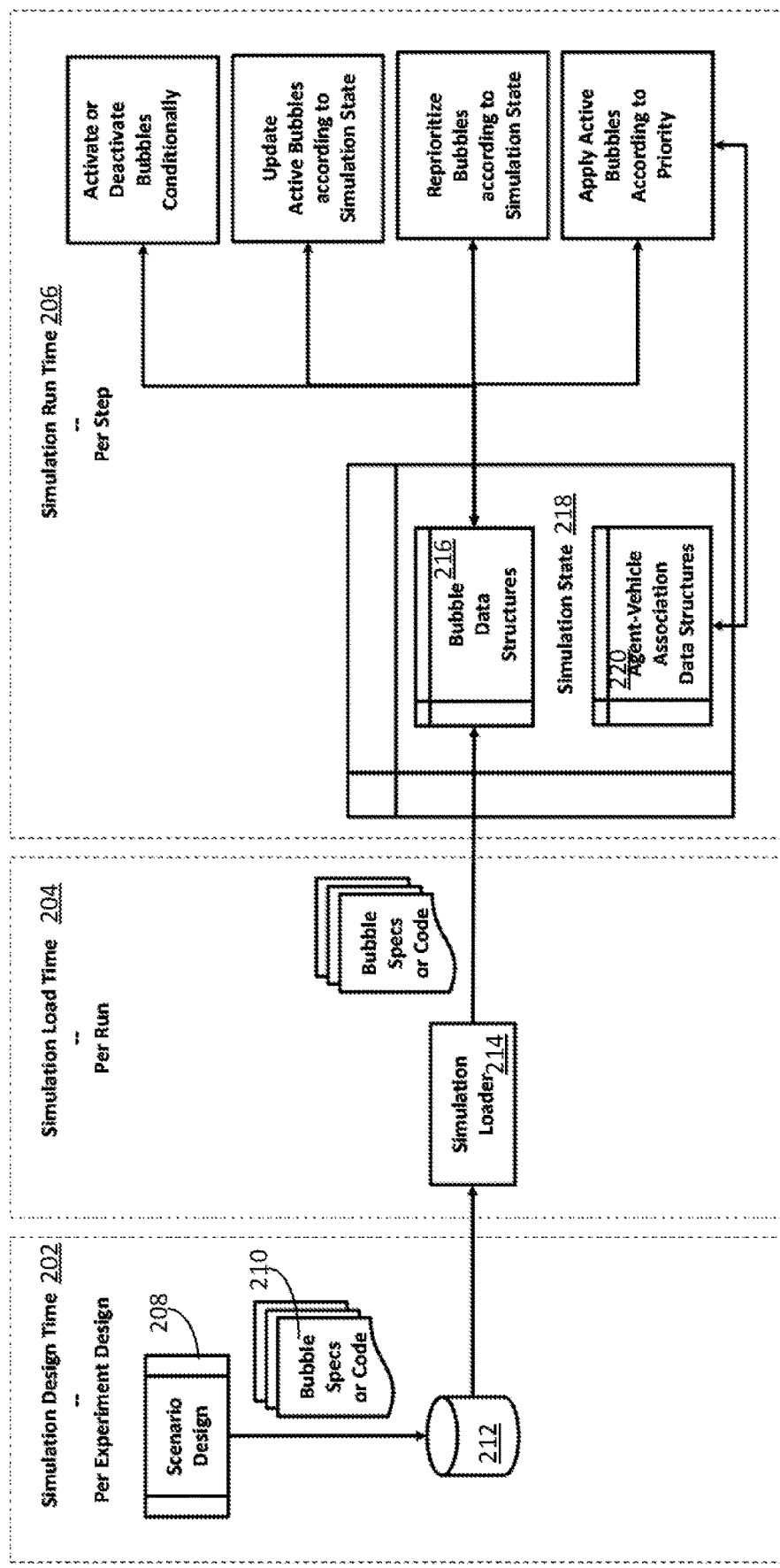
FIG. 2 illustrates operations performed by a bubble manager of the simulator system of FIG. 1.

FIG. 2 is a block diagram illustrating operations performed by bubble manager 108 according to an example embodiment during a simulation design time 202, a simulation load time 204, and simulation run time 206. In the illustrated example, bubbles are managed according to their specification, preparation, instantiation, and use. Bubbles are specified according to their spatiotemporal and conditional boundaries during the time when a simulation is designed by a scenario design process 208 at simulation design time 202. Bubbles that are specified by bubble design process 208 are stored as bubble specifications 210. Each bubble specification 210 also includes information about which social agents 104 are expected to control which simulated social vehicles 124 that fall into a specific bubble. The bubble specification 210 is saved into an allocated storage 212, from which the bubble specification 210 is loaded by a simulation loader 214 as part of the simulation loading at simulation load time 214. As a result, bubble data structures 216 that specify the attributes of a bubble are stored in simulator system 100 memory. During the simulation run time 206, bubbles that are dynamically managed will be activated according to the conditions of their instantiation specified in the bubble data structure 216. Agent-vehicle association data structures 220 are also stored in simulator system 100 memory and dynamically updated by the bubble manager 108 to keep track of the agent-vehicle association, which determines which social agents 104 receive which observations about the simulated social vehicle and the simulated environment from which simulated social vehicles 124 and which simulated social vehicles 124 will receive and execute which actions from which social agents 124.

In example embodiments, bubble manager 108 uses a zone-based transition method to manage the dynamic change of an agent-vehicle association and a corresponding observation and action transmission and execution. In some applications, the zone-based transition method that is described below facilitates smooth handover of control of a simulated social vehicle 124 from one social agent 104 to another social agent 104. A transition zone of a bubble is differentiated from a zone of an agent. The zone of an agent is the part of the bubble in which the intended agent-vehicle association is fully in effect. The concept of the transition zone and its use is shown in FIG. 3.

Figure 3:
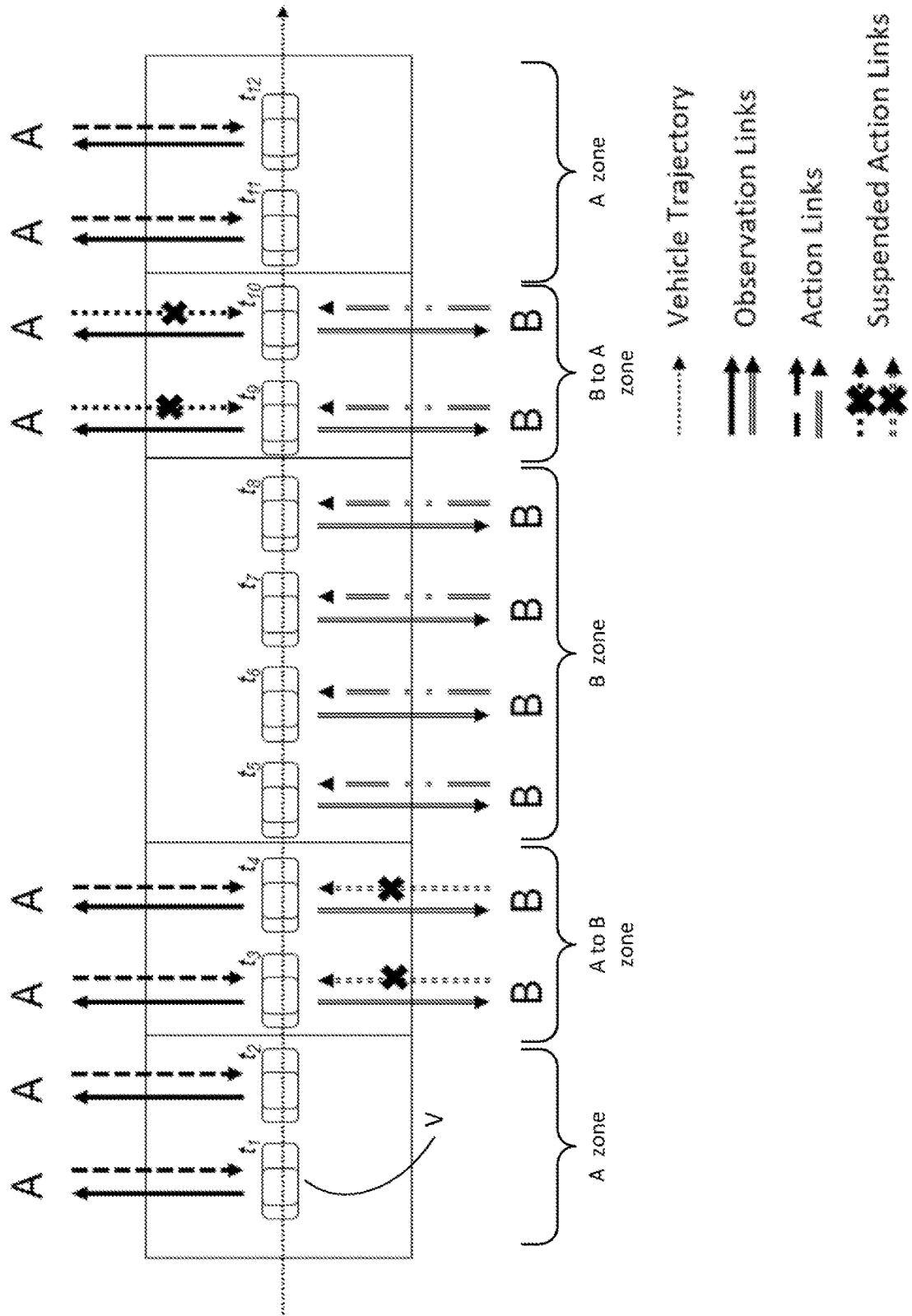
FIG. 3 graphically illustrates an example of a zone-based transition performed by the bubble manger.

FIG. 3 illustrates the passage of a vehicle V (e.g., a social vehicle 124) at 12 different simulation time steps (e.g., time $t_1$ to $t_{12}$), during which control of the Vehicle V is handed between Agent A (e.g. social agent 104A) and Agent B (e.g. social agent 104B). Vehicle V initially is under the control of Agent A and travels from a first bubble (Agent A bubble) in which agent a controls the Vehicle V into a further bubble (Agent B Bubble) in which Agent B is expected to control vehicle V and then continues to travel to exit the Agent B bubble and return into the Agent A bubble in which Agent A is expected to control V. Agent A bubble includes an "A Zone" and Agent B bubble includes a "B Zone". Between the A Zone and the B Zone are transition zones, called A=>B Transition Zone and B=>A Transition Zone, respectively to help manage the handover.

As vehicle V enters the A=>B Transition Zone, Agent A continues to control V as before. Accordingly, the A=>B Transition Zone is also part of the Agent A bubble. However, as vehicle V is in the A=>B Transition Zone, Agent B will start preparing to assume control. In particular, Agent B will start receiving observations about the vehicle and the environment from vehicle V, execute its internal logic (e.g. apply its behavior policy (i.e. behavior model) to the received observations), and generate actions based on the received observations.

Agent B may apply a different behavior model (i.e. behavior policy) than Agent A and thus expects different observations than the observations that Agent A has been receiving from vehicle V. This could mean for example a new set of virtual sensors needs to be instantiated and appropriately initialized, which could take up to m simulation time steps. In addition to the need for initialization of the new virtual sensors, any internal states Agent B relies on to appropriately generate actions may also require multiple time steps to initialize appropriately. For example, Agent B may need to rely on the history of n time steps to accurately estimate the environment state or predict into the future and then generate an action according to the estimated state or predicted future, in which case Agent B's action will only be ready to use after n time steps. Consequently, the A=>B Transition Zone needs to be big enough to accommodate the required number of simulation steps max (m,n) that is required to appropriately prepare Agent B for the control of Vehicle V, as well as to make any required modifications to Vehicle V.

In example embodiments, while vehicle V is in the A=>B Transition Zone, during which Agent B starts running or operating at the same time in overlap with Agent A, the actions generated by Agent B are not used to control vehicle V. This allows Agent B time to properly initialize and time for any new sensors to be brought online. In the A=>B Transition Zone, Agent B may not be ready to control vehicle V yet. If the control is switched to B prematurely, undesirable and unnatural behavior of the vehicle V (e.g. abrupt change of direction or sudden acceleration and deceleration that is not due to environmental reality etc.) may result and thus detract from the realism of the simulation. In short, when vehicle V is in the A=>B Transition Zone, Agent A continues to control vehicle V and Agent B's action link to vehicle V is suspended or otherwise rendered ineffectual.

Once the vehicle V is in the B Zone, Agent B assumes control of vehicle V. On the other end of the B Zone, as vehicle V exits B Zone to go back to A Zone, during the B=>A Transition Zone the Agent B continues to control vehicle and bubble manager 108 similarly regulates: (1) observation links from vehicle V to Agents A and B, (2) action links from Agents A and B to vehicle V (with action link from Agent A to Vehicle V suspended and only Agent B controlling vehicle V), and (3) corresponding Agent A-specific initialization of sensors and computation states. Thus, the B=>A Transition Zone is also part of the Agent B bubble.

Figure 4:
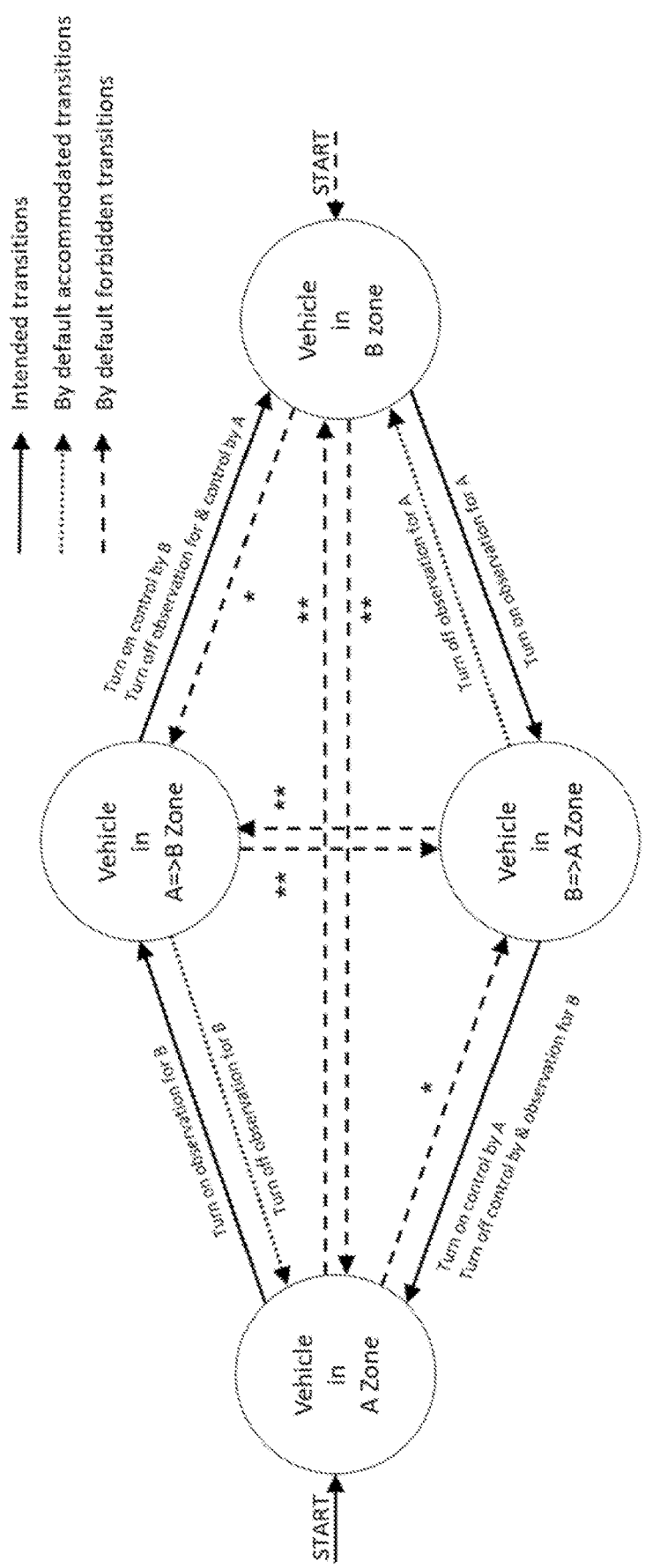
FIG. 4 depicts a state diagram of a finite state machine of logic used for using transitions zones according to examples.

In the illustrated example, a respective transitions zone sits in between two zones to facilitate the control handover in both directions. The overall logic of such transition management using transitions zones may be implemented in a finite state machine and summarized in a state diagram of the finite state machine that is depicted in FIG. 4. In the state diagram depicted in FIG. 4, accommodated transitions may be taken by default. In some examples, "Turn off observation" transitions could be made optional. If a required observation is left on, then transitions marked with * may be taken. Transitions marked with ** are by default forbidden, unless the incoming Agents requires no initialization, is purely reactive, or the resulting abrupt transition-in change is tolerable.

In the example of FIG. 3, the relationships between the A Zone and B Zone and between A=>B Zone and B=>A Zone are illustrated as completely symmetrical. However, the duration or length of the transition zones need not be symmetrical so long as the number of simulation time steps required for a smooth handover are provided. In example embodiments, (1) transitions that skip the transition zones are not allowed by default, (2) transitions that goes backwards from B Zone to A=>B Zone or from A Zone to B=>A Zone are not allowed, and (3) transitions that are compatible with the above explained regulations are allowed.

In some example embodiments, the transitions that would in the default configuration be forbidden on the basis that they skip transition zones may be permitted if the bubble manager 108 determines that the incoming agent and its required sensors and controllers require no initialization over time, is purely reactive (i.e. only react to the current observation without any regard for the recently history or possible future), or the resulted-in abrupt change is tolerable.

While both FIG. 3 and FIG. 4 depicts that observations are turned off for Agent B when vehicle V is in A Zone and observations are turned off for Agent A when vehicle V is in B Zone, in some example this requirement could be made optional, especially if there is enough compute resources to run the virtual sensors that supply observations. The reason for this is that multiple agents simultaneously receiving observations from the same vehicle, which is the case in A=>B and B=>A Transition Zones, does not lead to conflict, as opposed to when multiple agents simultaneously control the same vehicle.

Figure 5:
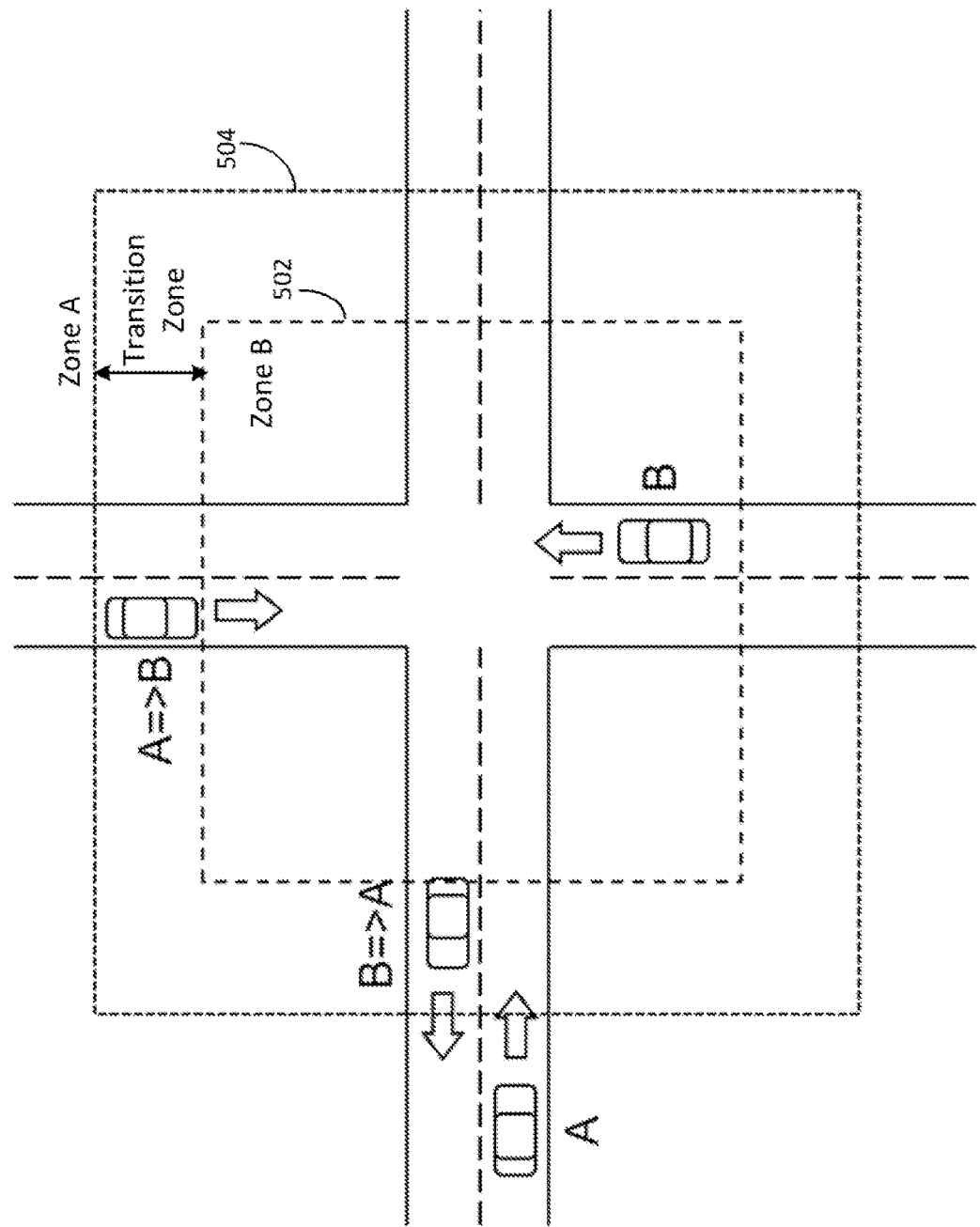
FIG. 5 depicts a simulation scenario that uses a static map-based zone.

Referring to FIG. 5, in some example simulations, the transition A=>B Zone and B=>A Zone may be allowed to coincide spatiotemporally. In the example of FIG. 5, Zone A (located outside of square 505 in FIG. 5) surrounds zone B (represented by square 502 in FIG. 5) with an intervening transition zone. In such a case, there is only a single physical transition tone with its appropriate spatiotemporal boundary. However, two Logical Transition Zones can be defined by considering how a vehicle enters the physical transition zone. If the vehicle enters the physical transition zone by exiting the B Zone, it is deemed as entering the B=>A Logical Transition Zone. If the vehicle enters the physical transition zone by exiting the A Zone, it is deemed as entering the A=>B Logical Transition Zone. Actual management of handover is based on logical zones. Accordingly, the Agent A bubble encompasses Zone A and the Transition Zone when vehicle V is travelling in the A=>B Logical Transition Zone, and the Agent B bubble encompasses Zone B and the Transition Zone when vehicle V is travelling in the B=>A Logical Transition Zone.

Unless specified otherwise, the example embodiments described below refer to logical transition zones.

The example illustrated in FIG. 5 represents a simulation scenario in which bubble manager 108 performs transition management in the context of a static map-based zone. In particular, a static bubble is introduced around a specific intersection in a simulation map. The B Zone with a well-defined boundary (rectangle 502) is completely enclosed by a larger Physical Transition Zone (area between rectangle 502 and rectangle 504), which supports two Logical Transition Zones. The A Zone is defined as anywhere outside the outer boundary 504 of the Physical Transition Zone. Such an A Zone illustrates a general default configuration of using a default agent to which control is always handed as the vehicle exits the B zone. This default agent corresponds to an all-encompassing "background bubble".

The B Zone and its associated transition zone correspond to specific areas on the map. These areas could be specified through referencing map elements such as areas around a specific intersection, or a particular lane or road section. It could also be specified through referencing locations expressible in the coordinate system of the map.

In example embodiments, the simulator system 100 that employs bubble manager 108 may provide one or more of the following features:

Realism: The disclosed system and method may enable coherent integration and smooth handover that allows autonomous driving software agents, such as ML-based autonomous driving software agents that trained either by imitation learning from real data or by reinforcement learning from sophisticated interaction) to be used alternately to control social vehicles, leading to more realistic interactions in the simulation.

Diversity: By allowing diverse autonomous driving software agents to alternately control social vehicles where and when they are good at it and in spite of their differences in observation, action, internal states, history dependency, and computational dependency, simulations can be designed that have much more variability and information content (e.g. as measured by description length). Support for such diversity also opens up the possibility of crowd-sourcing agents for social vehicles.

Computing: Realistic simulation (even realism in interaction rather than sensor data) can require a significant amount of computing resources. The disclosed system and method allows computing resources to be elastically used on behavior simulation so as to give the ego agents the most relevant experience for training, testing, evaluation, or validation.

Scalability: By adaptively devoting computing resources to only the relevant parts of the simulation, while keeping the rest of simulation at low fidelity, scaling of the simulation to larger maps and many more social vehicles may be enabled.

Figure 6:
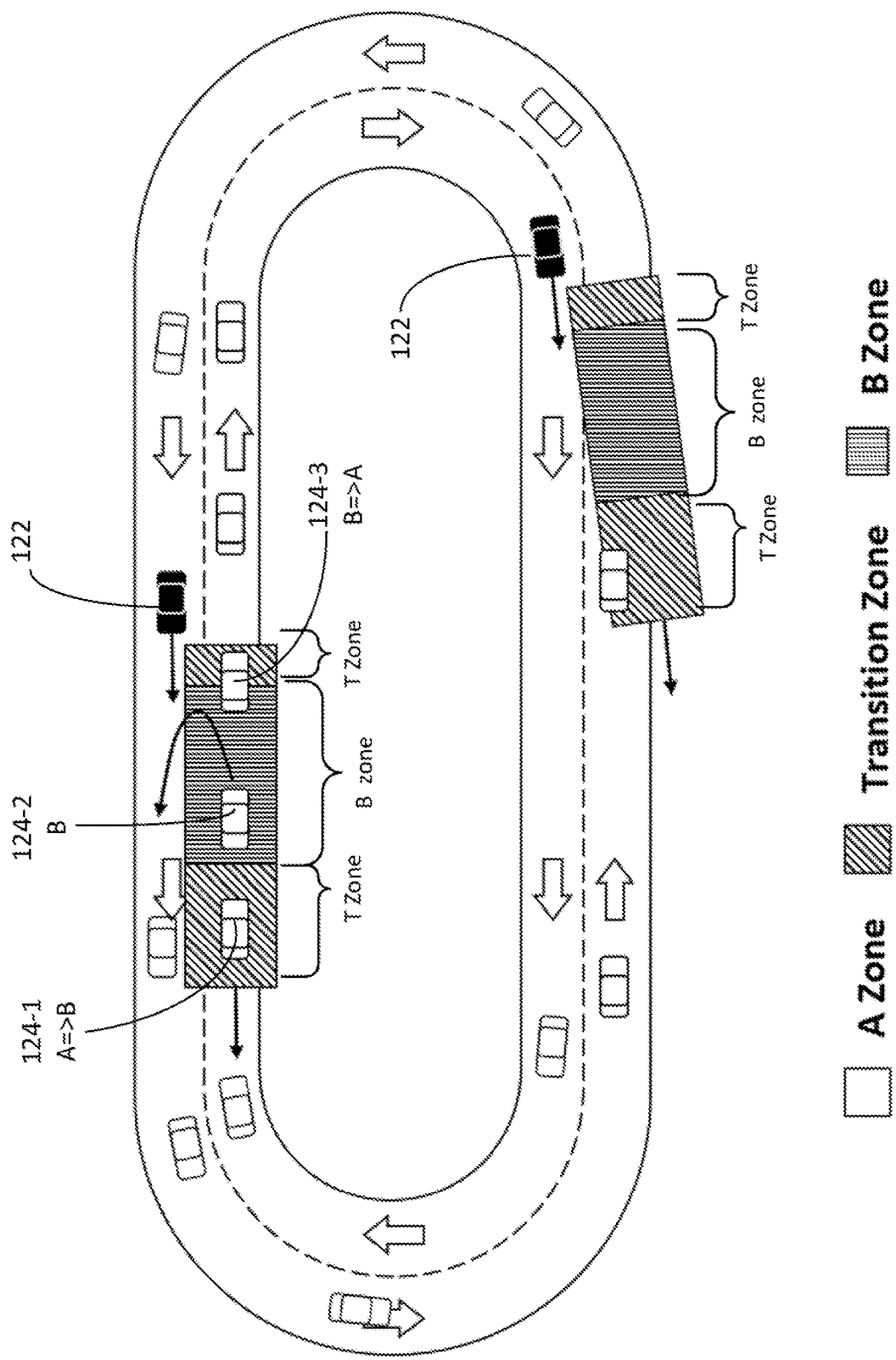
FIG. 6 depicts a simulation scenario in which a bubble is associated with and moves with an ego vehicle.

FIG. 6 discloses a further example simulation that employs an egocentric, travelling bubble. In this embodiment, a travelling bubble (e.g., a bubble including the "B zone") together with the associated transition zones are specified and attached to (with a certain stable relative positioning) a travelling simulated ego vehicle 122. As the simulated ego vehicle 122 travels, the bubble moves along with it (maintaining relative positioning).

In the example, the B agent directs the simulated social vehicle 124-2 to make a U turn. Transition zones ("T zones" in FIG. 6) are defined and used in a manner similar to that discussed above, except that there may be some restrictions as to through which edges the transition zones could be entered: if a vehicle crosses from the upper or lower sides, they may not be counted as having entered the transition zone and no handover happens. In addition, a probabilistic handover is illustrated: the simulated social vehicle 124-3 shown entering B to A transition zone did not make a U turn even though it was in a position to do so. Simulated social vehicle 124-1 is shown in the A to B transition zone.

In the embodiment of FIG. 6, an ego-centric travelling bubble allows the control of simulated social vehicles 124 around the simulated ego vehicle 122 to be handed over to specific agents (such as a U-turn agent) so as to trigger desirable interactive behavior with the ego agent. By doing this, as the simulated ego vehicle 122 travels along a certain routes, the traffic everywhere else unrelated to the simulated ego vehicle 122 could be simulated with much lower interaction fidelity with much less compute and much simpler behavior models (i.e. behavior policies). But wherever the ego agent goes, specifically relevant agents start to control the simulated social vehicles 124 around it and offering most realistic and meaningful interaction with the appropriate amount of computing and behavior model (i.e., behavior policy) complexity.

Figure 7:
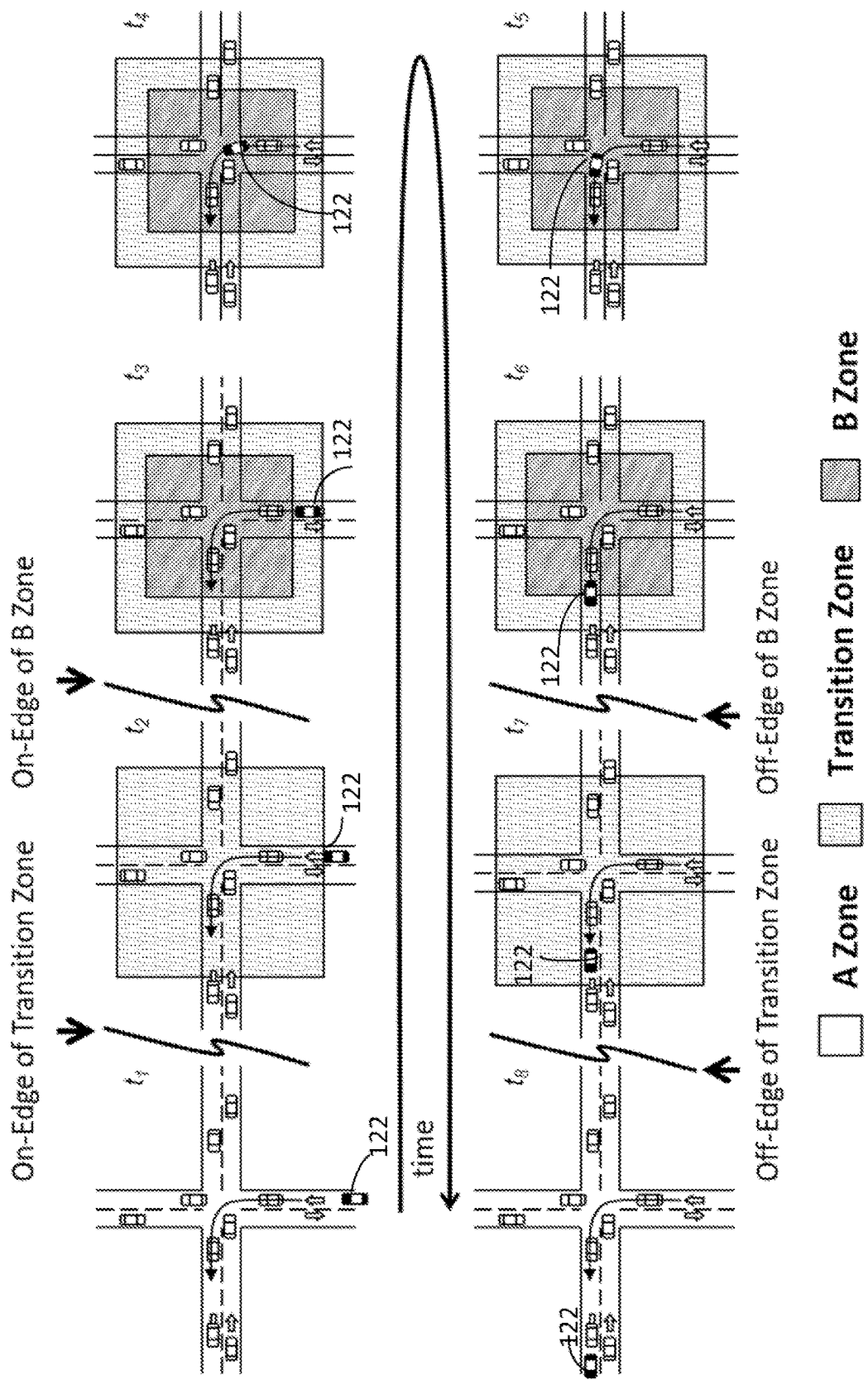
FIG. 7 depicts a simulation scenario showing a conditional bubble with temporal boundaries.

FIG. 7 illustrates an example simulation that demonstrates a conditional bubble with temporal boundaries. In this embodiment, the bubble is anchored to an intersection, but is conditionally activated by a simulated ego vehicle 122 approaching the intersection. Moreover, the associated zones of the bubble also have temporal boundaries (between t1 & t2, t2 & t3, t6 & t7, and t7 & t8) that follow the required order: Transition Zone comes on before B Zone and goes off after B Zone. Also illustrated is handovers for the simulated ego vehicle 122. That the Transition Zone needs to come up first and stay for enough number of time steps before the B Zone comes up is a spatiotemporal version of using a spatial only transition zone to ensure the smooth transition. This is the added technical complexity, but the underlying logic is essentially similar to the spatial and travelling embodiments.

Temporal bubbles could also have a global spatial scope in that a temporal bubble could cover the entire area of the simulation. For example, at 7:30 am in simulated time, all vehicles, including the ego vehicles, could shift to use the "rush-hour" versions of their corresponding agents. For another example, when the condition for raining is set, all vehicles could shift to use "rainy-weather" versions of their corresponding agents.

The use of general conditionally triggered zones with temporal boundaries (temporal on-set and off-set) can enable bubbles and transition zones to be introduced where there is none. This allows dynamically creating or activating bubbles according to arbitrarily complex conditions not restricted to map regions or ego-vehicle location as in the previous two embodiments. It thus gives flexibility of adaptively changing the vehicle-agent association according to different needs. Moreover, it can also be used to globally regulate the vehicle-agent association.

As described above, the bubble manager 108 enables spatiotemporal and conditional regions ("bubbles") to specify desired agent-vehicle assignment and to register the observation, action, computation, and initialization requirements for managing dynamic changes of the assignment.

In various example embodiments, at least one of the bubbles and the associated zones may be spatially specified with respect to a map. In various applications, bubbles and their associated zones may be spatiotemporal, may be purely time based, may be conditionally activated according to the simulation state, may travel with traffic participants, may serve as global defaults, and may be priority-managed.

In example embodiments, bubbles can be updated and applied per simulation step according to bubble specification and the simulation state. In some examples the bubble is structured in terms of transition zones and agent zones, with the transition zones being sandwiched (spatiotemporal and conditionally) between two agent zones. In example embodiments, the temporal sequence of the zones in the temporal embodiment follows the specified order: Transition Zone comes on before Incoming-Agent Zone (B Zone) and goes off after Outgoing-Agent Zone (B Zone).

The above description has focused transitioning social vehicle-social agent associations. The systems and methods described herein may also be used to transition ego agent-ego vehicle associations in some applications. For example, different ego agents 102 may be provided to control different versions of a simulated ego vehicle 122. Each version of a simulated ego vehicle 112 has a different AI controller that is being trained to learn a behavior model (i.e., behavior policy), so as to ensure realism and diversity of these specific ego agent's experience in a simulation while using a reasonable amount of computing resources.

Although the embodiments described above have been articulated in terms of vehicle control, it could be generalized to non-vehicle traffic participants, especially pedestrians, and non-vehicle traffic actors such as traffic lights. Both pedestrians and traffic lights in a simulated environment could use complex agents to make the related interaction realistic. For example, pedestrians may behave very differently in rural areas and in urban areas, in a big crowd or alone. Likewise, the traffic light policy could change at 4 pm to cope with the afternoon rush hour. Accordingly, the different bubble manager 108 may be applied to facilitate a transition in control between agents for any controllable object.

Further, in some examples, a transition zone could be used to manage multiple agents or controllers for the physical ego vehicle while it travels on real roads. For example, if two different sets of agent policies are used to control the ego vehicle for highway driving and city-street driving, we could use our bubble and transition zones to manage the handover to ensure a physically smooth and safe transition.

Transition zone idea could also be used in other domains either in simulation or in the real world where transition is between diverse agents with different observation types and action types.

In example embodiments, the components, modules, systems and agents described above can be implemented using one or more computer devices, servers or systems that each include a combination of a hardware processing circuit and machine-readable instructions (software and/or firmware) executable on the hardware processing circuit. A hardware processing circuit can include any or some combination of a microprocessor, a core of a multi-core microprocessor, a microcontroller, a programmable integrated circuit, a digital signal processor, or another hardware processing circuit.

Figure 8:
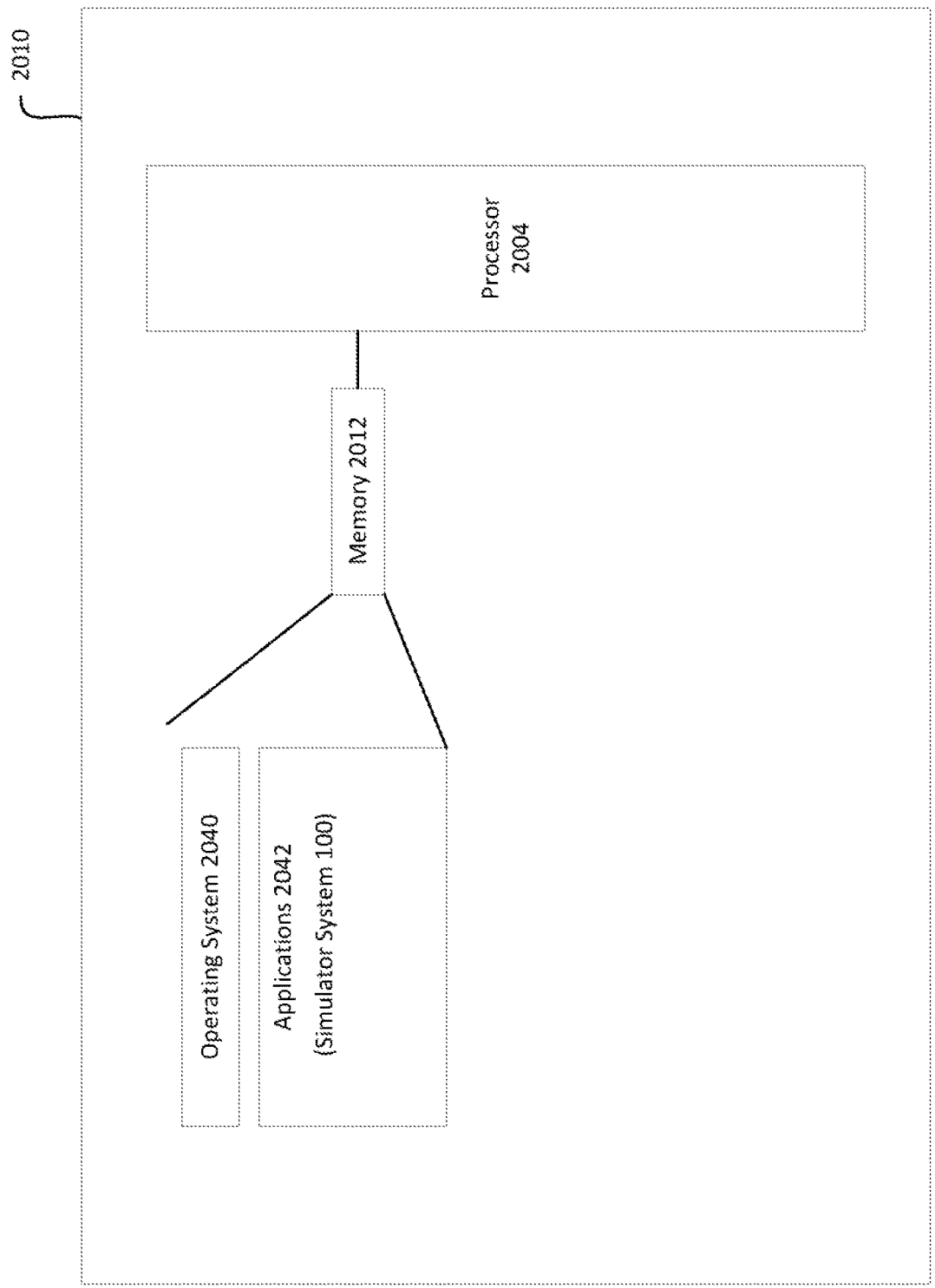
FIG. 8 shows a block diagram of a computer system that may be used to implement features of the simulator system of FIG. 1.

Referring to FIG. 8, an example embodiment of a computer system 2010 for implementing one or more of the modules, systems and agents included in simulator system 100 will be described. The system 2010 comprises at least one processor 2004 which controls the overall operation of the system 2010. Processor 2004 may include one or more central processing units, graphic processing units, AI processing units (such as neural processing units, tensor processing units, field programmable gate arrays, or application specific integrated circuits configured to perform AI computations), and related hardware accelerators. The least one processor 2004 is coupled to a plurality of components via a communication bus (not shown) which provides a communication path between the components and the processor 2004. The system comprises memories 2012 that can include Random Access Memory (RAM), Read Only Memory (ROM), a persistent (non-volatile) memory which may be one or more of a magnetic hard drive, flash erasable programmable read only memory (EPROM) ("flash memory") or other suitable form of memory.

Operating system software 2040 executed by the processor 2004 may be stored in the persistent memory of memories 2012. A number of applications 202 executed by the processor 2004 are also stored in the persistent memory. The applications 2042 can include software instructions for implementing the systems, methods, agents and modules, including the simulator system 100 described above. Software instructions of the simulator system 100 are executable by the at least one processor 2004 to perform the methods described above. The coding of software for carrying out the above-described methods is within the scope of a person of ordinary skill in the art having regard to the present disclosure.

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., a personal computer, a server, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A computer implemented method for controlling a behavior of an object, comprising:

controlling the behavior of the object during a first time period by using a first agent that applies a first behavior policy to map first policy observations obtained pursuant to the first behavior policy about the object and an environment in the first time period to a corresponding first policy control action that is applied to the object;

transitioning control of the behavior of the object from the first agent to a second agent during a transition period following the first time period; and controlling the behavior of the object during a second time period following the transition period by using the second agent that applies a second behavior policy to map second policy observations obtained pursuant to the second behavior policy about the object and the environment in the second time period to a corresponding second policy control action that is applied to the object;

wherein during the transition period the first agent applies the first behavior policy to map first policy observations about the object and the environment in the transition period to a corresponding first policy control action that is applied to the object and the second agent applies the second behavior policy to map second policy observations about the object and the environment in the transition period to a corresponding second policy control action that is not applied to the object, the method is applied during a simulation run, the object is a simulated object and the first policy observations and second policy observations about the object and the environment are simulated observations about the object and the environment, and the object is a simulated social vehicle operating in a simulated environment that also includes a simulated ego vehicle that is controlled throughout the first time period, transition period and second time period by a respective ego agent that applies an ego behavior policy to map ongoing observations about the ego vehicle and the environment to corresponding ego vehicle control actions that are applied to the ego vehicle.

2. The method of claim 1 wherein the first policy observations mapped by the first behavior policy and the second policy observations mapped by the second behavior policy are each from respective, different, observation spaces.

3. The method of claim 1 wherein during the transition period a set of first policy observations about the object and the environment is modified to include observations about the object and the environment required by the second behavior policy.

4. The method of claim 1 wherein the first time period corresponds to when the object is present in a first zone defined by a first spatiotemporal boundary, the second time period corresponds to when the object is present in a second zone defined by a second spatiotemporal boundary, and the transition period corresponds to when the object is present in a transition zone between the first zone and the second zone, the method including performing the transitioning upon detecting presence of the object in the transition zone following presence of the object in the first zone.

5. The method of claim 1 further comprising:
transitioning control of the behavior of the object from the second agent to the first agent during a further transition period following the second time period; and
wherein during the further transition period the second agent applies the second behavior policy to map second policy observations about the object and the environment in the second transition period to a corresponding second policy control action that is applied to the object and the first agent applies the first behavior policy to map first policy observations about the object and the environment in the further transition period to a corresponding first policy control action that is not applied to the object.

6. The method of claim 1 wherein the first time period corresponds to when the object is present in a first zone defined by a first spatiotemporal boundary, the second time period corresponds to when the object is present in a second zone defined by a second spatiotemporal boundary, and the transition period corresponds when the object is present in a transition zone between the first zone and the second zone, the method including performing the transitioning upon detecting presence of the object in the transition zone following presence of the object in the first zone, and wherein the second zone and the transition zone are fixed in a virtual position that moves with the virtual location of the simulated ego vehicle within the simulated environment.

7. The method of claim 1 wherein the first time period corresponds to when the object is present in a first zone defined by a first spatiotemporal boundary, the second time period corresponds to when the object is present in a second zone defined by a second spatiotemporal boundary, and the transition period corresponds to when the object is present in a transition zone between the first zone and the second zone, the method including performing the transitioning upon detecting presence of the object in the transition zone following presence of the object in the first zone, and wherein the second zone and the transition zone are fixed in a virtual position that is stationary with a virtual physical location within the simulated environment.

8. The method of claim 1 wherein the first behavior policy is less computationally intensive than the second behavior policy.

9. The method of claim 8 wherein the second behavior policy is configured to map second policy observations about the object and the environment from an observation space that is enriched relative to an observation space that the first behavior policy is configured to map first policy observations from.

10. The method of claim 9 wherein the second behavior policy is configured to map second policy observations about the object and the environment to second policy control actions from an action space that is enriched relative to an action space that the first behavior policy is configured to map first policy observations about the object and the environment to first policy control actions from.

11. A computer system comprising:
a processor; and
a non-transitory memory coupled to the processor, the memory storing instructions that, when executed by the processor, configure the computer system to:
control the behavior of an object during a first time period by using a first agent that applies a first behavior policy to map first policy observations obtained pursuant to the first behavior policy about the object and an environment in the first time period to a corresponding first policy control action that is applied to the object;
transition control of the behavior of the object from the first agent to a second agent during a transition period following the first time period; and
control the behavior of the object during a second time period following the transition period by using the second agent that applies a second behavior policy to map first policy observations obtained pursuant to the second behavior policy about the object and the environment in the second time period to a corresponding second policy control action that is applied to the object;
wherein during the transition period the first agent applies the first behavior policy to map first policy observations about the object and the environment in the transition period to a corresponding first policy control action that is applied to the object and the second agent applies the second behavior policy to map second policy observations about the object and the environment in the transition period to a corresponding second policy control action that is not applied to the object,
wherein the instructions, when executed by the processor, configure the computer system to perform a simulation run, wherein the object is a simulated object and the first policy observations and second policy observations about the object and the environment are simulated observations about the object and the environment;
wherein the object is a simulated social vehicle operating in a simulated environment that also includes a simulated ego vehicle that is controlled throughout the first time period, transition period and second time period by a respective ego agent that applies an ego behavior policy to map ongoing observations about the ego vehicle and the environment to corresponding ego vehicle control actions that are applied to the ego vehicle.

12. The computer system of claim 11 wherein the first policy observations mapped by the first behavior policy and the second policy observations mapped by the second behavior policy are each from respective, different, observation spaces.

13. The computer system of claim 11 wherein during the transition period a set of first policy observations about the object and the environment are modified to include observations about the object and the environment required by the second behavior policy.

14. The computer system of claim 11 wherein the first time period corresponds to when the object is present in a first zone defined by a first spatiotemporal boundary, the second time period corresponds to when the object is present in a second zone defined by a second spatiotemporal boundary, and the transition period corresponds to when the object is present in a transition zone between the first zone and the second zone, and further including performing the transitioning upon detecting presence of the object in the transition zone following presence of the object in the first zone.

15. The computer system of claim 11 wherein the memory stores further instructions that, when executed by the processor, configure the computer system to transition control of the behavior of the object from the second agent to the first agent during a further transition period following the second time period; and wherein during the further transition period the second agent applies the second behavior policy to map second policy observations about the object and the environment in the second transition period to a corresponding second policy control action that is applied to the object and the first agent applies the first behavior policy to map first policy observations about the object and the environment in the further transition period to corresponding first policy control actions that are not applied to the object.

16. A computer program product comprising a non-transitory computer medium storing instructions that when executed by a processor, configure the computer system to:
   control the behavior of an object during a first time period by using a first agent that applies a first behavior policy to map first policy observations obtained pursuant to the first behavior policy about the object and an environment in the first time period to a corresponding first policy control action that is applied to the object;
   transition control of the behavior of the object from the first agent to a second agent during a transition period following the first time period; and
   control the behavior of the object during a second time period following the transition period by using the second agent that applies a second behavior policy to map first policy observations obtained pursuant to the second behavior policy about the object and the environment in the second time period to a corresponding second policy control action that is applied to the object;
wherein during the transition period the first agent applies the first behavior policy to map first policy observations about the object and the environment in the transition period to a corresponding first policy control action that is applied to the object and the second agent applies the second behavior policy to map second policy observations about the object and the environment in the transition period to a corresponding second policy control action that is not applied to the object,
wherein the instructions, when executed by the processor, configure the computer system to perform a simulation run, wherein the object is a simulated object and the first policy observations and second policy observations about the object and the environment are simulated observations about the object and the environment;
wherein the object is a simulated social vehicle operating in a simulated environment that also includes a simulated ego vehicle that is controlled throughout the first time period, transition period and second time period by a respective ego agent that applies an ego behavior policy to map ongoing observations about the ego vehicle and the environment to corresponding ego vehicle control actions that are applied to the ego vehicle.

* * * * *